US005627007A

United States Patent [19]

Van den Bergh et al.

[11] Patent Number: 5,627,007

[45] Date of Patent: May 6, 1997

[54] METHOD FOR USE FORMATION OF AN IMPROVED IMAGE

[75] Inventors: Rudolf Van den Bergh, Herenthout; Johan Lamotte, Leuven; André Bellens, Pulle, all of Belgium

[73] Assignee: Agfa-Gevaert N.V., Mortsel, Belgium

[21] Appl. No.: 544,661

[22] Filed: Oct. 18, 1995

[30] Foreign Application Priority Data

Oct. 24, 1994 [EP] European Pat. Off. .............. 94203084

[51] Int. Cl.[6] .............................. G03C 5/16; G03F 7/34; G03B 27/32

[52] U.S. Cl. ........................... 430/200; 430/22; 430/333; 430/346; 430/394; 430/494; 430/945; 430/964; 358/480; 358/408; 355/26

[58] Field of Search ............................ 430/22, 200, 333, 430/394, 494, 346, 945, 964; 358/480, 408; 355/26

[56] References Cited

U.S. PATENT DOCUMENTS 5,426,014 6/1995 Kelly et al. ............................ 430/200

*Primary Examiner*—Richard L. Schilling

*Attorney, Agent, or Firm*—Brumbaugh, Graves, Donohue & Raymond

[57] ABSTRACT

A method for exposing a radiation sensitive material is disclosed comprising a double-sided laser exposure of the same information in register on both sides. In a preferred embodiment this material is a thermal imaging medium comprising a support, an image forming layer preferably containing carbon black, a release layer and an adhesive layer. By laser exposing this medium in register on both sides a heat mode image can be obtained after lamination and delamination which shows practically no pinhole defects.

11 Claims, No Drawings

METHOD FOR USE FORMATION OF AN IMPROVED IMAGE

FIELD OF THE INVENTION

The present invention relates to a method for obtaining images with improved physical properties.

BACKGROUND OF THE INVENTION

Conventional photographic materials based on silver halide are used for a large variety of applications. For instance, in the pre-press sector of graphic arts rather sensitive camera materials are used for obtaining screened images. Scan films are used for producing colour separations from multicolour originals. Phototype setting materials record the information fed to phototype- and image setters. Relative insensitive photographic materials serve as duplicating materials usually in a contact exposure process. Other fields include materials for medical recording, duplicating and hard copy, X-ray materials for non-destructive testing, black-and-white and colour materials for amateur- and professional still photography and materials for cinematographic recording and printing.

Silver halide materials have the advantage of high potential intrinsic sensitivity and excellent image quality. On the other hand they show the drawback of requiring several wet processing steps employing chemical ingredients which are suspect from an ecological point of view.

In the past several proposals have been made for obtaining an imaging element that can be developed using only dry development steps without the need of processing liquids as it is the case with silver halide photographic materials.

A dry imaging system known since quite a while is 3M's dry silver technology. It is a catalytic process which couples the light-capturing capability of silver halide to the image-forming capability of organic silver salts.

Another type of non-conventional materials as alternative for silver halide is constituted by so-called photo mode materials based on photopolymerisation. The use of photopolymerizable compositions for the production of images by information-wise exposure thereof to actinic radiation is known since quite a while. All these methods are based on the principle of introducing a differentiation in properties between the exposed and non-exposed parts of the photopolymerizable composition e.g. a difference in solubility, adhesion, conductivity, refractive index, tackiness, permeability, diffusibility of incorporated substances e.g. dyes etc.. The thus produced differences may be subsequently employed in a dry treatment step to produce a visible image and/or master for printing e.g. a lithographic or electrostatic printing master.

As a further alternative for silver halide chemistry dry imaging elements are known that can be image-wise exposed using an image-wise distribution of heat. These types of dry imaging elements called heat mode materials (or thermal imaging materials, thermal recording materials or thermographic materials) offer the advantage in addition to an ecological advantage that they do not need to be handled in a dark room nor is any other protection from ambient light needed. Heat mode recording materials, based on change of adhesion, are disclosed in e.g. U.S. Pat. No. 4,123,309, U.S. Pat. No. 4,123,578, U.S. Pat. No. 4,157,412, U.S. Pat. No. 4,547,456 and PCT publ. Nos. WO 88/04237 and WO 93/03928, and international appl. No. PCT EP94/02063. In a preferred embodiment such a thermal imaging medium comprises a transparent support and an imaging layer containing carbon black, optionally additional layers and a stripping sheet. By the conversion of intense laser light into heat on information-wise exposure a surface part of the support liquefies and firmly locks the carbon black, so that after delamination a negative carbon black image is formed on the support.

With several kind of materials which are exposed by specular laser radiation through a transparent support, whether being conventional silver halide or non-conventional materials, the following problem arises. Transparent polymeric resin supports such as polyethylene terephthalate supports tend to contain microscopic dust particles, or catalyst rest particles, or microscopic voids (so-called fish-eyes) which scatter the incoming laser beam so that it does not reach the radiation sensitive layer anymore at the proper location. In negative working systems this leads to the formation of so-called pinholes; in positive working systems it causes the formation of so-called pinpoints. The same phenomenon is caused by the presence of dust or scratches on the surface of the support or in the optionally present subbing layer. This defect is particularly striking in negative working heat mode systems, bases on change of adhesion as described above, where the pinholes become apparent after the delamination step. The defect is most disturbing in recorded full areas, where the pinholes appear as tiny white spots on a black background, and less in recorded separate lines and dots. Although these pinholes, depending on their size are hardly disturbing for practical applications of the finished image, e.g. as a master for the exposure of a printing plate or of a duplicating material, they give the image an unsatisfactory outlook, especially when inspected by means of a magnifying glass.

It is an object of the present invention to provide a method for the formation of an image which is substantially free of the pinhole or pinpoint defect.

It is a further object of the present invention to provide an improved method for the formation of a heat mode image, based on change of adhesion, which is substantially free of pinholes.

Other objects of the invention will become clear from the description hereinafter.

SUMMARY OF THE INVENTION

The objects of the present invention are realized by providing a method of information-wise exposing by means of laser radiation a radiation sensitive material comprising a transparent support and on one side thereof at least one radiation sensitive layer comprising one or more compounds capable of producing information-wise differentiation between the exposed and non-exposed areas of said material, characterized in that the same information is recorded by simultaneous or consecutive exposure in register on both sides of said radiation sensitive material.

In a preferred embodiment the radiation sensitive material is a thermal imaging medium comprising:

(1) a transparent support having a surface part liquefiable by intense heat, (2) an image forming layer containing an image forming substance and a compound capable of transforming laser radiation into heat, said compound being the same or different from said image forming substance, (3) a release layer, (4) a permanent or thermal adhesive layer.

Before or after the information-wise double-sided exposure of the present invention a stripping sheet is laminated to the adhesive layer (4). After delamination a heat mode image is obtained substantially free of the pinhole defect.

DETAILED DESCRIPTION OF THE INVENTION

The present invention will now be explained in detail on the hand of its preferred embodiment, in which case the radiation sensitive material is a thermal imaging medium where the image differentiation is based on a change of adhesion.

As transparent support for the thermal imaging medium for use in the present invention polyethylene terephtalate is preferred. However other transparent polymeric resins, e.g. polycarbonate, polyvinylchloride, polyethylene, polypropylene or polystyrene can be used. The support preferably carries no subbing layer. The support can consist of just one transparent resin. Alternatively the support can have a double layer structure comprising a transparent resin as defined above and an extra polymeric layer, a so-called "overcoat" comprising e.g. polystyrene, a copolyester, polycarbonate, a (meth)acrylic resin, a phenolic resin, a polyurethane, an epoxy resin, a cellulose derivative, or mixtures or copolymers of these monomers. Preferred polymers for use in the overcoat are polystyrene and copoly (styrene-acrylonitrile).

In the image forming layer the image forming substance is preferably a pigment, e.g. a magnetic pigment, e.g. iron oxides, a coloured piment, e.g. copper phtalocyanine, or metal particles. However the most preferred pigment is carbon black. It can be used in the amorphous or in the graphite form. The preferred average particle size of the carbon black ranges from 0.01 to 1 μm. Different commercial types of carbon black can be used, preferably with a very fine average particle size, e.g. RAVEN 5000 ULTRA II (Columbian Carbon Co.), CORAX L6, FARBRUSS FW 2000, SPEZIALSCHWARZ 5, SPEZIALSCWARZ 4A, SPEZIALSCHWARZ 250 and PRINTEX U (all from Degussa Co.).

When using carbon the image forming substance and the compound transforming intense laser radiation into heat is one and the same product. When however the image forming substance is not absorptive for the laser radiation, which is preferably infra-red laser radiation, an extra compound, preferably an infra-red absorbing compound is required for transforming the radiation into heat. This infra-red absorbing compound can be a soluble infra-red absorbing dye or a dispersable infra-red absorbing pigment. Infra-red absorbing compounds are known since a long time and can belong to several different chemical classes, e.g. indoaniline dyes, oxonol dyes, porphine derivatives, anthraquinone dyes, merostyryl dyes, pyrylium compounds and sqarylium derivatives.

A suitable infra-red dye can be chosen from the numerous disclosures and patent applications in the field, e.g., from U.S. Pat. Nos. 4,886,733, 5,075,205, 5,077,186, 5,153,112, 5,244,771, from Japanese unexamined patent publications (Kokai) Nos. 01-253734, 01-253735, 01-253736, 01-293343, 01-234844, 02-3037, 02-4244, 02-127638, 01-227148, 02-165133, 02-110451, 02-234157, 02-223944, 02-108040, 02-259753, 02-187751, 02-68544, 02-167538, 02-201351, 02-201352, 03-23441, 03-10240, 03-10239, 03-13937, 03-96942, 03-217837, 03-135553, 03-235940, and from the European published patent applications publ. Nos. 0 483 740, 0 502 508, 0 523 465, 0 539 786, 0 539 978 and 0 568 022, and from European patent application appl. No. 94200797. This list is far from exhaustive and limited to rather recent disclosures.

It will be clear that mixtures of pigments, or mixtures of one or more pigments and one or more compounds transforming radiation into heat can be used.

As binders for the image forming layer gelatin, polyvinylpyrrolidone, polyvinylalcohol, hydroxyethylcellulose, polyethyleneoxide and a broad variety of polymer latices can be considered. These latices can be film forming or non-film forming. They can comprise acid groups as a result of which they can swell in an alkaline coating medium and/or become totally or partially soluble. In this way the layer properties can be strongly influenced, e.g. less coating and drying point defects will appear. When choosing a particular type of carbon black and a particular type of polymeric binder the ratio of the amounts of both has to be optimized for each case. The preferred binder is gelatin.

The thickness of the image forming layer is preferably comprised between 0.5 and 1.5 micron. When carbon is used as the image forming substance the thickness of the layer is preferably limited corresponding to an optical density of at most 3.0. When using higher densities the laser beam incoming from the coated side will be absorbed too strongly before it reaches the interface support carbon layer so that no sufficient heat can be produced anymore.

The release layer contains a binder and one or more of the typical ingredients for release layers known in the art such as waxes, polyethylene, silicones, fluorated polymers such as Teflon, silica particles (e.g. SEAHOSTAR KE types, Nippon Shokukai Co), colloidal silica, polymeric beads (e.g. polystyrene, polymethylmethacrylate), hollow polymeric core/shear beads (e.g. ROPAQUE particles, Rohm and Haas Co), beads of siliconised pigments like siliconised silica (e.g. TOSPEARL types, Toshiba Silicones Co), and matting agents. In a particularly preferred embodiment of the present invention the release layer contains a mixture of polyethylene and Teflon. The preferred coverage of the release layer ranges between 0.1 and 3 g/m$^2$.

The adhesive layer (4) can contain a permanent adhesive, also called pressure-sensitive adhesive polymer, or a thermoadhesive, also called heat-sensitive polymer. A survey of pressure and/or thermal adhesives is given by J. Shields in "Adhesives Handbook", 3rd. ed. (1984), Butterworths—London, Boston, and by Ernest W. Flick in "Handbook of Adhesive Raw Materials" (1982), Noyens Publications, Park Ridge, N.J.—U.S.A.

Examples of pressure-sensitive adhesive resins are described in U.S. Pat. No. 4,033,770 for use in the production of adhesive transfers (decalcomanias) by the silver complex diffusion transfer process, in the Canadian Patent 728,607 and in the U.S. Pat. No. 3,131,106. Pressure-sensitive adhesives are usually composed of (a) thermoplastic polymer(s) having some elasticity and tackiness at room temperature (about 20° C.), which is controlled optionally with a plasticizer and/or tackifying resin. A thermoplastic polymer is completely plastic if there is no recovery on removal of stress and completely elastic if recovery is instantaneous and complete.

Particularly suitable pressure-sensitive adhesives are selected from the group of polyterpene resins, low density polyethylene, a copoly(ethylene/vinyl acetate), a poly ($C_1$–$C_{16}$)alkyl acrylate, a mixture of poly($C_1$–$C_{16}$)alkyl acrylate with polyvinyl acetate, and copoly(vinylacetate-acrylate) being tacky at 20° C.

In the production of a pressure-adhesive layer an intrinsically non-tacky polymer may be tackified by the adding of a tackifying substance, e.g. plasticizer or other tackifying resin.

Examples of suitable tackifying resins are the terpene tackifying resins described in the periodical "Adhesives Age", Vol. 31, No. 12, November 1988, p. 28–29.

In case adhesive layer (4) is a thermal adhesive layer (or thermoadhesive layer, or TAL) it contains one or more thermoadhesive polymers having a glass transition temperature $T_g$ preferably comprised between 20° and 60° C. For ecological and practical reasons the TAL is preferably coated from an aqueous medium. Therefore the polymers are preferably incorporated as latices. Other additives can be present into the TAL to improve the layer formation or the layer properties, e.g. thickening agents, surfactants, levelling agents, thermal solvents and pigments.

Preferred latices are styrene-butadiene latices. These latices can contain other comonomers which improve the stablitity of the latex, such as acrylic acid, methacrylic acid and acrylamide. Other possible polymer latices include polyvinylacetate, copoly(ethylene-vinylacetate), copoly (acrylonitrile-butadiene-acrylic acid), copoly(styrene-butylacrylate), copoly(methylmethacrylate-butadiene), copoly(methylmethacrylate-butylmethacrylate), copoly (methylmethacrylate-ethylacrylate), copolyester(terephtalic acid-sulphoisophtalic acid-ethyleneglycol), copolyester (terephtalic acid-sulphoisophtalic acid-hexanediol-ethyleneglycol).

Particularly suitable polymers for use in the TAL layer are the BAYSTAL polymer types, marketed by Bayer AG, which are on the basis of styrene-butadiene copolymers. Different types with different physical properties are available. The styrene content varies between 40 and 80 weight %, while the amount of butadiene varies between 60 and 20 weight %; optionally a few weight % (up to about 10%) of acrylamide and/or acrylic acid can be present. Most suited are e.g. BAYSTAL KA 8558, BAYSTAL KA 8522, BAYSTAL S30R and BAYSTAL P1800 because they are not sticky at room temperature when used in a TAL layer. Other useful polymers are the EUDERM polymers, also from Bayer AG, which are copolymers comprising n.-butylacrylate, methylmethacrylate, acrylonitrile and small amounts of methacrylic acid.

Alternatively to direct coating on top of the release layer the TAL can be coated on a separate temporary support. In that case the TAL is laminated to the release layer and then the temporary support is removed by delamination.

The stripping sheet can be laminated or adhered by pressure to the adhesive layer (4) after or before the double-sided laser exposure. In the case where the lamination of the stripping sheet is performed before exposure the stripping sheet self-evidently must be transparent to the laser radiation. This transparent stripping sheet can be composed of any of the same polymeric resins suitable for use as support. As for the support a polyethylene terephthalate sheet is preferred. Its thickness if preferably comprised between 10 and 200 micron. Preferably it is somewhat thinner than the support for ecological reasons. When the medium is exposed before lamination the stripping sheet can also be an opaque sheet such as a paper base, e.g. a plain paper base or a polyethylene coated paper.

The thermal image medium as described above is exposed information-wise on both sides in register by means of an intense laser beam. Such a laser can be an Ar ion laser, a HeNe laser, a Kr laser, a frequency doubled Nd-YAG laser, a dye laser emitting in the visual spectral region. However in the preferred embodiment where the radiation to heat converting compound is an infra-red absorbing compound the laser is an infra-red laser. Especially preferred lasers are semiconductor diode lasers or solid state lasers such as a Nd-YAG laser emitting at 1064 nm, or a Nd-YLF laser emitting at 1053 nm.. Other possible infra-red laser types include diode lasers emitting at 823 nm or diode lasers emitting at 985 nm. Important parameters of the laser recording are the spot diameter (D) measured at the $1/e^2$ value of the intensity, the applied laser power on the film (P), the recording speed of the laser beam (v) and the number of dots per inch (dpi).

The double-sided recording of the same information on both sides of each particular spot of the thermal imaging medium can be performed consecutively. The laser exposure can be first performed through the backside of the support and then through the coated side, or vice versa. However this way of handling poses serious registering problems since the medium must be placed and held twice in exactly the same position during the consecutive recordings. The registering problem can be alleviated by performing the exposure on both sides simultaneously, e.g. in a recording apparatus equipped with a laser beam splitting device.

As stated above the lamination of the stripping sheet to the TAL can be performed before or after the double-sided exposure. Lamination may be conducted by putting the two materials in contact and then introducing the materials into the nip of a pair of heated laminating rollers under suitable pressure. Suitable laminating temperatures usually range from approximately 60° C. to 120° C., preferably from 70° C. to 100° C.

Finally the heat mode image is dry developed by delamination. This can be performed manually or in a delamination apparatus. In a preferred way of doing the stripping layer is held planar and the medium is peeled off at an angle of about 180° at a speed of about 10 m/min. As a result, the image forming layer and the release layer adhere to the support in the information-wise exposed parts, and the image forming layer, the release layer and the thermoadhesive layer adhere to the stripping sheet in the information-wise non-exposed parts. So a negative heat mode image is formed on the support and a positive is formed on the stripping sheet. Optionally the images can be protected by means of a protective layer or laminate. When the recorded information is provided by a phototype- or image-setter the heat mode image(s) can be used as masters for the exposure of a printing plate or a graphic arts duplicating material.

Although the present invention is explained in detail on the hand of its preferred embodiment it will be clear that the exposure method of the present invention can be performed on any other type of radiation sensitive material which is sensitive to the pinhole or pinpoint defect when exposed by specular laser radiation through its support. Such other material types include media for heat mode recording based on vacuum deposited metal layers, media based on photopolymerisation, thermal or photothermal media based on reduction of an organic silver salt, etc..

The present invention will be illustrated by the following examples without however being limited thereto.

EXAMPLES

Example 1

A thermal imaging medium was prepared with a composition according to the data of table 1 hereinafter (RL standing for release layer and C-L for carbon layer):

TABLE 1

| layer | composition | quantity | coverage |
|---|---|---|---|
| TAL | Copoly(styrene-butadiene-acrylamide 60/30/10) = BAYSTAL KA8522, Bayer | 25 g/m$^2$ | 25 g/m$^2$ |
| RL | polyethylene | 0.5 g/m$^2$ | 0.85 g/m$^2$ |
| | Teflon (HOSTAFLON TF VP23D, Hoechst | 0.25 g/m$^2$ | |
| | gelatine | 0.1 g/m$^2$ | |
| C-L | Carbon black (CORAX L6) | 1.0 g/m$^2$ | 2.2 g/m$^2$ |
| | copoly(ethylacrylate/methamethyl-acrylate/methacrylic acid; 60/23/17) | 0.8 g/m$^2$ | |
| | ULTRAVON W (Ciba-Geigy) | 0.4 g/m$^2$ | |

This thermal imaging medium was exposed information-wise, first through the back side, then in register through the coated side, under the following conditions (table 2):

TABLE 2

| | |
|---|---|
| lasertype | NdYLF 1053 nm |
| spot diameter | 18 μm (1/e$^2$ diameter) |
| linear recording speed | 32 m/s |
| laser power on medium | 0.7 W |

After the double recording a stripping sheet, consisting of subbed polyethylene terephthalate of 100 μm. thickness was laminated to the TAL at a speed of 0.5 m/min at 85° C.

The delamination was performed by holding the stripping sheet planar and peeling off the medium under an angle of 180° at a speed of 10 m/min.

The obtained Dmax was 3.0 (visual) and 3.5 (UV); Dmin was 0.05 (visual) and 0.07 (UV). From the recorded test pattern it was clear that a resolution up to a 20 μm dot was possible. The recorded full areas contained practically no pinholes (<1 pinhole/cm$^2$). The image was scratch resistant.

In a control experiment only one exposure through the backside was given. The recorded full areas contained on average 50 pinholes/cm$^2$.

Example 2

The experiment was identical to example 1 with the exception that a paper base (Ideal Brillant Blanc paper) was used as stripping sheet. Similar results were obtained as in example 1.

We claim:

1. Method of information-wise exposing by means of laser radiation a radiation sensitive material comprising a transparent support and on one side thereof at least one radiation sensitive layer comprising one or more compounds capable of producing information-wise differentiation between the exposed and non-exposed areas of said material, characterized in that the same information is recorded by simultaneous or consecutive exposure in register on both sides of said radiation sensitive material.

2. Method according to claim 1 wherein said radiation sensitive material is a thermal imaging medium comprising:

(1) a transparent support having a surface part liquefiable by intense heat, (2) an image forming layer containing an image forming substance and a compound capable of transforming laser radiation into heat, said compound being the same or different from said image forming substance, (3) a release layer, (4) a permanent or thermal adhesive layer.

3. Method according to claim 1 wherein said laser radiation is produced by an infra-red laser.

4. Method for the formation of a heat mode image comprising the following steps:

(A) providing a thermal imaging medium comprising:

(1) a transparent support having a surface part liquefiable by intense heat, (2) an image forming layer containing an image forming substance and a compound capable of transforming laser radiation into heat, said compound being the same or different from said image forming substance, (3) a release layer, (4) a permanent or thermal adhesive layer, (B) either, (i) recording by simultaneous or consecutive exposure by means of a laser the same information in register on both sides of the thermal imaging medium, (ii) laminating a stripping sheet on top of said adhesive layer (4), and (iii) peeling-apart said support and said stripping sheet whereby the image forming layer and at least part of the release layer adhere to the support in the information-wise exposed parts, and whereby the image forming layer, the release layer and the adhesive layer adhere to the stripping sheet in the information-wise non-exposed parts, so that a negative image is formed on said support, or, (i') laminating a transparent stripping sheet on top of the adhesive layer, (ii') recording by simultaneous or consecutive exposure by means of a laser the same information in register on both sides of said thermal imaging medium, and (iii') peeling-apart said support and said stripping sheet whereby the image forming layer and at least part of the release layer adhere to the support in the information-wise exposed parts, and whereby the image forming layer, the release layer and the adhesive layer adhere to the stripping sheet in the information-wise non-exposed parts, so that a negative image is formed on said support.

5. Method according to claim 4 wherein said image forming substance is a pigment.

6. Method according to claim 5 wherein said pigment is carbon black.

7. Method according to claim 6 wherein said image forming layer containing carbon black has an optical density of at most 3.0.

8. Method according to claim 1 wherein said transparent support is polyethylene terephthalate support.

9. Method according to claim 1 wherein said transparent support has a double structure comprising a transparent resin and an overcoat, positioned between said transparent resin and the image forming layer.

10. Method according to claim 9 wherein said overcoat comprises a polymer chosen from the group consisting of polystyrene and copoly(styrene-acrylonitrile).

11. Thermal imaging method according to claim 2 wherein said adhesive layer (4) is a thermoadhesive layer having a glass transition temperature $T_g$ between 20° C. and 60° C.

* * * * *

UNITED STATES PATENT AND TRADEMARK OFFICE

CERTIFICATE OF CORRECTION

PATENT NO. : 5,627,007

DATED : May 6, 1997

INVENTOR(S) : Van den Bergh et al.

It is certified that error appears in the above-identified patent and that said Letters Patent is hereby corrected as shown below:

Column 10, line 4, "Thermal imaging method" should read --Method--.

Signed and Sealed this

Seventeenth Day of March, 1998

Attest:

Bruce Lehman

BRUCE LEHMAN

*Attesting Officer* *Commissioner of Patents and Trademarks*